(12) United States Patent
Nakayama et al.

(10) Patent No.: US 11,726,456 B2
(45) Date of Patent: *Aug. 15, 2023

(54) SUBSTRATE PROCESSING SYSTEM

(71) Applicant: KOKUSAI ELECTRIC CORPORATION, Tokyo (JP)

(72) Inventors: Masanori Nakayama, Toyama (JP); Tsukasa Kamakura, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/863,596

(22) Filed: Apr. 30, 2020

(65) Prior Publication Data
US 2020/0257269 A1 Aug. 13, 2020

Related U.S. Application Data

(63) Continuation of application No. 15/706,871, filed on Sep. 18, 2017, now Pat. No. 10,671,056.

(30) Foreign Application Priority Data

Jul. 20, 2017 (JP) .................................. 2017-140865

(51) Int. Cl.
*G05B 19/418* (2006.01)
*H01L 21/67* (2006.01)
(Continued)

(52) U.S. Cl.
CPC ....... *G05B 19/418* (2013.01); *G05B 19/0421* (2013.01); *G05B 23/0235* (2013.01); *H01L 21/67276* (2013.01); *G05B 2219/2602* (2013.01)

(58) Field of Classification Search
None
See application file for complete search history.

(56) References Cited

U.S. PATENT DOCUMENTS 4,679,137 A * 7/1987 Lane .................... G05B 19/409
700/83
5,375,061 A * 12/1994 Hara ................ G05B 19/41865
700/101
(Continued)

FOREIGN PATENT DOCUMENTS

JP 2000252179 A 9/2000
JP 2003324044 A 11/2003
(Continued)

OTHER PUBLICATIONS

Taiwanese Office Action dated Jul. 12, 2018 for the Taiwanese Patent Application No. 106131426.
(Continued)

*Primary Examiner* — Kenneth M Lo
*Assistant Examiner* — Istiaque Ahmed
(74) *Attorney, Agent, or Firm* — Volpe Koenig

(57) ABSTRACT

There is provided a substrate processing system, including: a plurality of substrate processing apparatuses; a first control part installed in each of the plurality of substrate processing apparatuses and configured to transmit a first apparatus data from each of the plurality of substrate processing apparatuses; a second control part configured to receive the first apparatus data from each of the plurality of substrate processing apparatuses, generate a priority data of each of the plurality of substrate processing apparatuses based on the first apparatus data, and transmit the priority data to the first control part; and a display part configured to display the priority data thereon.

17 Claims, 14 Drawing Sheets

(51) Int. Cl.
  *G05B 23/02* (2006.01)
  *G05B 19/042* (2006.01)

(56) References Cited

U.S. PATENT DOCUMENTS

| | | | |
|---|---|---|---|
| 2001/0051437 A1* | 12/2001 | Cruse | B81C 99/0065 |
| | | | 438/706 |
| 2003/0204488 A1 | 10/2003 | Sentoku et al. | |
| 2004/0235304 A1 | 11/2004 | Oh | |
| 2005/0125202 A1* | 6/2005 | Gotkis | G05B 23/0254 |
| | | | 257/E21.528 |
| 2005/0143952 A1* | 6/2005 | Tomoyasu | H01J 37/32935 |
| | | | 702/181 |
| 2008/0125899 A1 | 5/2008 | Numakura | |
| 2010/0045684 A1 | 2/2010 | Yamagami | |
| 2010/0131892 A1 | 5/2010 | Kang et al. | |
| 2011/0079177 A1 | 4/2011 | Asai et al. | |
| 2011/0082581 A1 | 4/2011 | Ozaki et al. | |
| 2012/0163943 A1* | 6/2012 | Isomura | H01L 21/67742 |
| | | | 414/217 |
| 2012/0253724 A1 | 10/2012 | Asai et al. | |
| 2012/0323855 A1 | 12/2012 | Koyama et al. | |
| 2014/0025677 A1 | 1/2014 | Asai et al. | |
| 2014/0225504 A1 | 8/2014 | Kaneko et al. | |
| 2014/0304196 A1 | 10/2014 | Kaushal et al. | |
| 2016/0147219 A1* | 5/2016 | Siddiqui | G05B 19/41865 |
| | | | 700/101 |

FOREIGN PATENT DOCUMENTS

| | | |
|---|---|---|
| JP | 2005294328 A | 10/2005 |
| JP | 2008135517 A | 6/2008 |
| JP | 2011061143 A | 3/2011 |
| JP | 2012216697 A | 11/2012 |
| JP | 2014519182 A | 8/2014 |
| KR | 10-2016-0063289 A | 6/2016 |
| TW | 200839473 A | 10/2008 |
| TW | 201122744 A | 7/2011 |
| TW | 201129886 A | 9/2011 |
| TW | 201142559 A | 12/2011 |
| TW | 201419013 A | 5/2014 |

OTHER PUBLICATIONS

Korean Office Action dated Jan. 4, 2019 for the Korean Patent Application No. 10-2017-0116068.
Japanese Office Action dated Jun. 4, 2019 for the Japanese Patent Application No. 2017-140865.
Chinese Office Action dated Jun. 23, 2021 for Chinese Patent Application No. 201710855159.5.

* cited by examiner

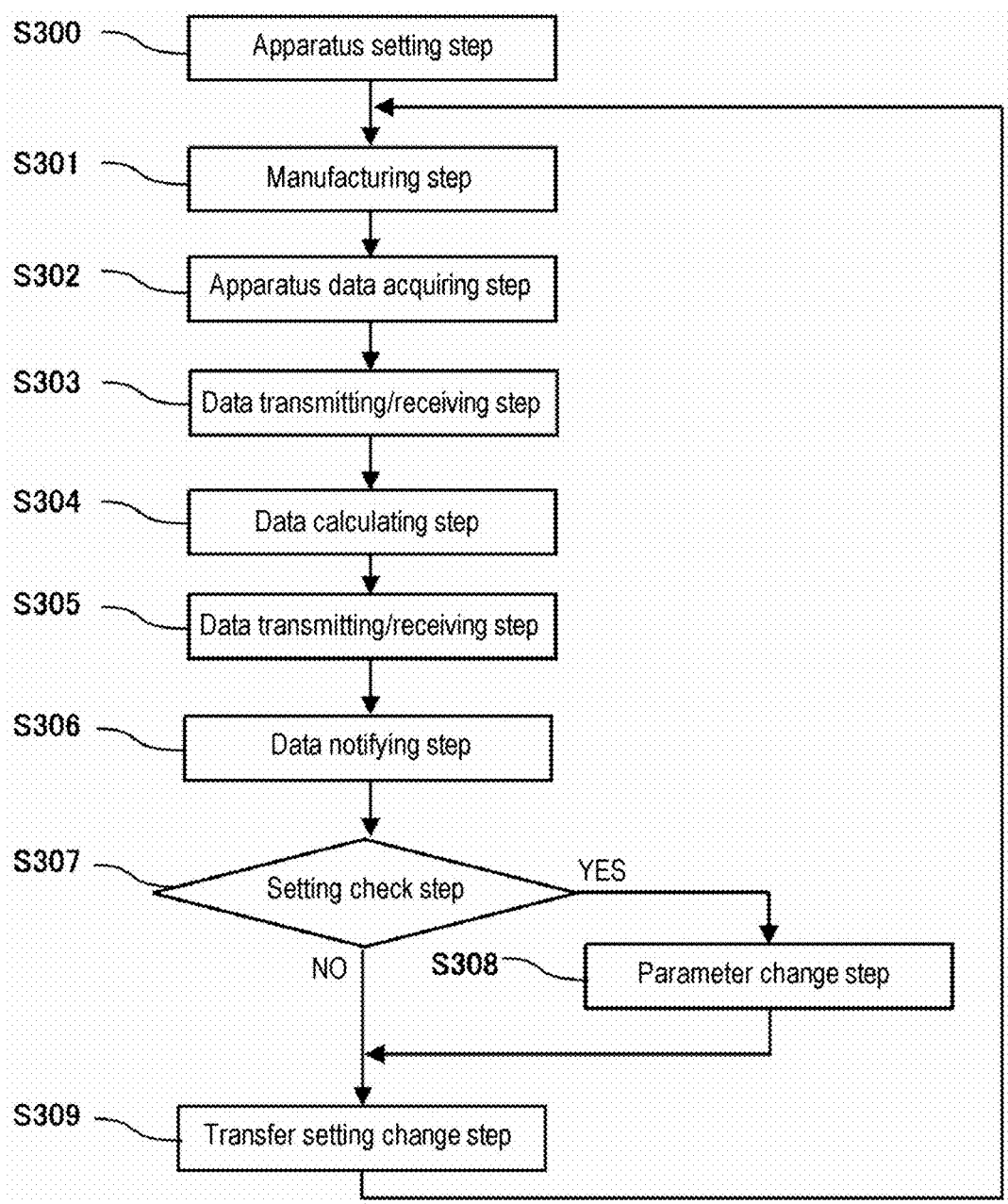

FIG. 6

| Measurement value | Relationship between measurement value and reference value | Measurement value of each part | First apparatus data A1 |
|---|---|---|---|
| Measurement value 1 (Temperature) | | X1  4 | a1  12 |
| Measurement value 2 (Gas flow rate) | | X2  6 | a2  36 |
| Measurement value 3 (Process chamber pressure) | | X3  6 | a3  30 |
| Measurement value 4 (High-frequency power) | | X4  3 | a4  6 |
| Measurement value 5 (Traveling wave power) | | X5  2 | a5  4 |
| Measurement value 6 (Reflective wave power) | | X6  1 | a6  2 |
| | | Comprehensive evaluation | α a  92 |

FIG. 7

| Measurement value | First apparatus data A1 | | First apparatus data B1 | | First apparatus data C1 | | ... | First apparatus data N1 | | Second apparatus data M1 (Higher-level apparatus data) | |
|---|---|---|---|---|---|---|---|---|---|---|---|
| Measurement value 1 (Temperature) | a1 | 12 | b1 | 11 | c1 | 9 | ... | n1 | 10 | y1 | 13 |
| Measurement value 2 (Gas flow rate) | a2 | 36 | b2 | 34 | c2 | 30 | ... | n2 | 31 | y2 | 38 |
| Measurement value 3 (Process chamber pressure) | a3 | 30 | b3 | 29 | c3 | 25 | ... | n3 | 27 | y3 | 32 |
| Measurement value 4 (High-frequency power) | a4 | 6 | b4 | 7 | c4 | 6 | ... | n4 | 6 | y4 | 7 |
| Measurement value 5 (Traveling wave power) | a5 | 4 | b5 | 5 | c5 | 4 | ... | n5 | 5 | y5 | 5 |
| Measurement value 6 (Reflective wave power) | a6 | 2 | b6 | 5 | c6 | 1 | ... | n6 | 3 | y6 | 3 |
| Comprehensive evaluation data | αa | 92 | αb | 91 | αc | 75 | ... | αn | 2 | αy | 2 |
| Yield ranking data | βa | 1 | βb | 2 | βc | 3 | ... | βn | n | βy | 1 |
| Priority data | γa | 1 | γb | 2 | γc | 3 | ... | γn | n | | |

FIG. 8

| Measurement value | First apparatus data A1 | Higher-level apparatus data | First apparatus data C1 | Substrate processing apparatus 100C Whether change of parameter is necessary |
|---|---|---|---|---|
| Measurement value 1 (Temperature) | a1  12 | y1  13 | c1  9 | c1p  Yes |
| Measurement value 2 (Gas flow rate) | a2  36 | y2  38 | c2  30 | c2p  Yes |
| Measurement value 3 (Process chamber pressure) | a3  30 | y3  32 | c3  25 | c3p  Yes |
| Measurement value 4 (High-frequency power) | a4  6 | y4  7 | c4  6 | c4p  No |
| Measurement value 5 (Traveling wave power) | a5  4 | y5  5 | c5  4 | c5p  No |
| Measurement value 6 (Reflective wave power) | a6  2 | y6  3 | c6  1 | c6p  No |
| Priority data | $\gamma a$  1 | $\gamma y$  1 | $\gamma c$  3 | $\gamma c$  3 |

FIG. 10

| Parameter | Set value (Apparatus C) |
|---|---|
| Temperature | 12 |
| Gas flow rate | 36 |
| Process chamber pressure | 30 |
| High-frequency power | — |
| Traveling wave power | — |
| Reflective wave power | — |

270d

OK

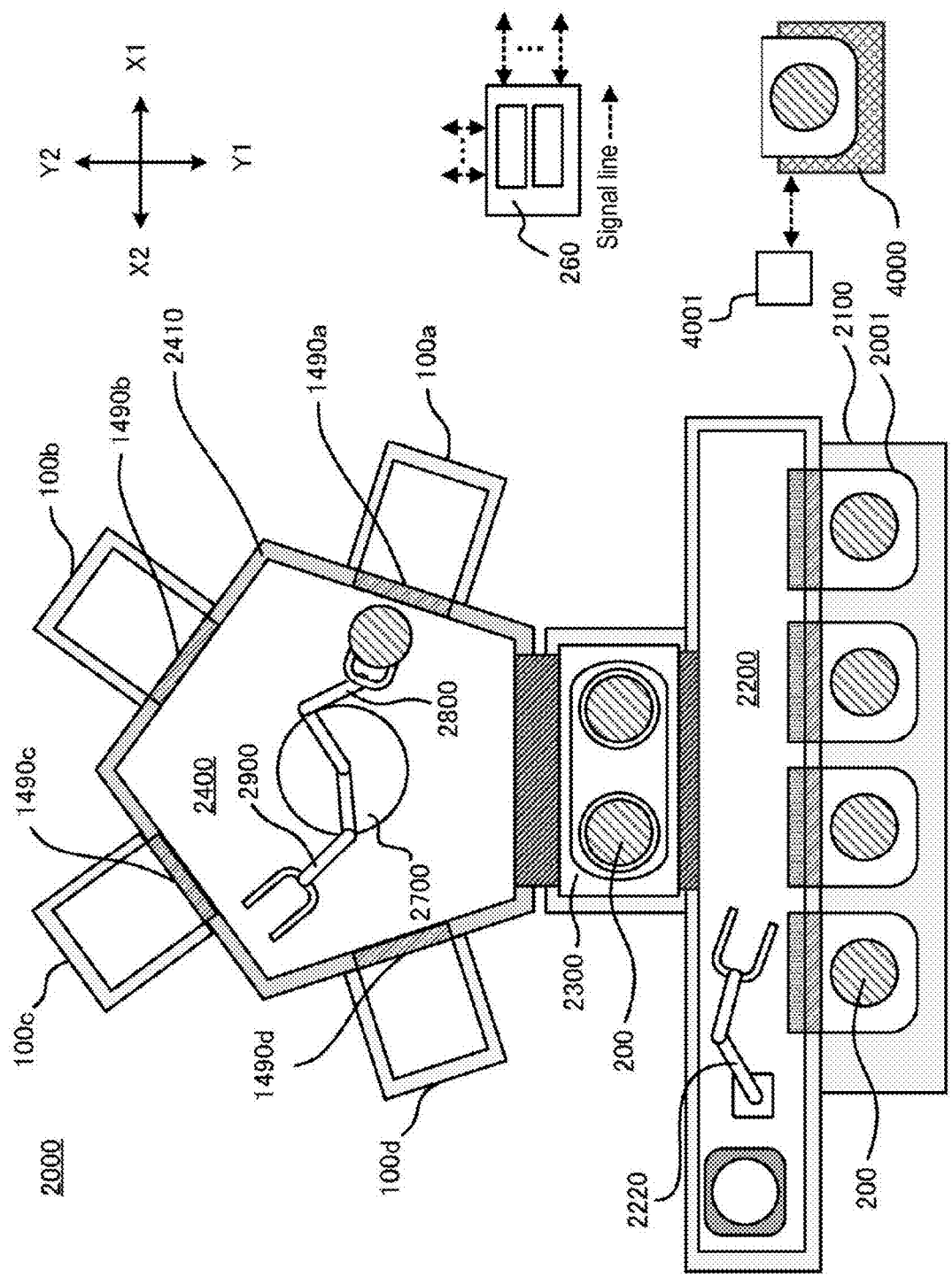

SUBSTRATE PROCESSING SYSTEM

CROSS-REFERENCE TO RELATED APPLICATION

This application is a continuation of U.S. patent application Ser. No. 15/706,871 filed Sep. 18, 2017, which claims the benefit of priority from Japanese Patent Application No. 2017-140865, filed on Jul. 20, 2017, the entire contents of which are incorporated herein by reference.

TECHNICAL FIELD

The present disclosure relates to a substrate processing system.

BACKGROUND

Along with the high integration of semiconductor devices represented by a large scale integrated circuit (LSI), a dynamic random access memory (DRAM), a flash memory and the like, circuit patterns or structures formed during the manufacturing process have been miniaturized. A substrate processing apparatus that performs one of various processes for manufacturing a semiconductor device performs fault detection & classification (FDC) with accumulated monitoring data to check the integrity of the apparatus and notifies of an abnormality by an alarm, thus preventing a defective product from being produced.

Due to individual variations in each apparatus, there is a problem that the process result for each substrate does not become uniform.

SUMMARY

Some embodiments of the present disclosure provide a technique capable of improving a process uniformity for each substrate.

According to one embodiment of the present disclosure, there is provided a substrate processing system, including: a plurality of substrate processing apparatuses; a first control part installed in each of the plurality of substrate processing apparatuses and configured to transmit a first apparatus data from each of the plurality of substrate processing apparatuses; a second control part configured to receive the first apparatus data from each of the plurality of substrate processing apparatuses, generate a priority data of each of the plurality of substrate processing apparatuses based on the first apparatus data, and transmit the priority data to the first control part; and a display part configured to display the priority data thereon.

BRIEF DESCRIPTION OF THE DRAWINGS

FIG. 5 is a flowchart of a substrate process according to one embodiment of the present disclosure.

FIG. 6 is an example of an apparatus data of a substrate processing apparatus according to one embodiment of the present disclosure.

FIG. 7 is an example of a data comparison table of a substrate processing system according to one embodiment of the present disclosure.

FIG. 8 is an example of a parameter change necessity determination table according to one embodiment of the present disclosure.

FIG. 10 is an example of a parameter change display according to one embodiment of the present disclosure.

FIG. 14 is a schematic configuration diagram of a cluster type substrate processing apparatus according to another embodiment of the present disclosure.

DETAILED DESCRIPTION

Embodiments of the present disclosure will now be described.

One Embodiment

One embodiment of the present disclosure will be described as below with reference to the drawings.

Hereinafter, a substrate processing system according to the present embodiment will be described.

(1) Configuration of Substrate Processing System

Figure 1:
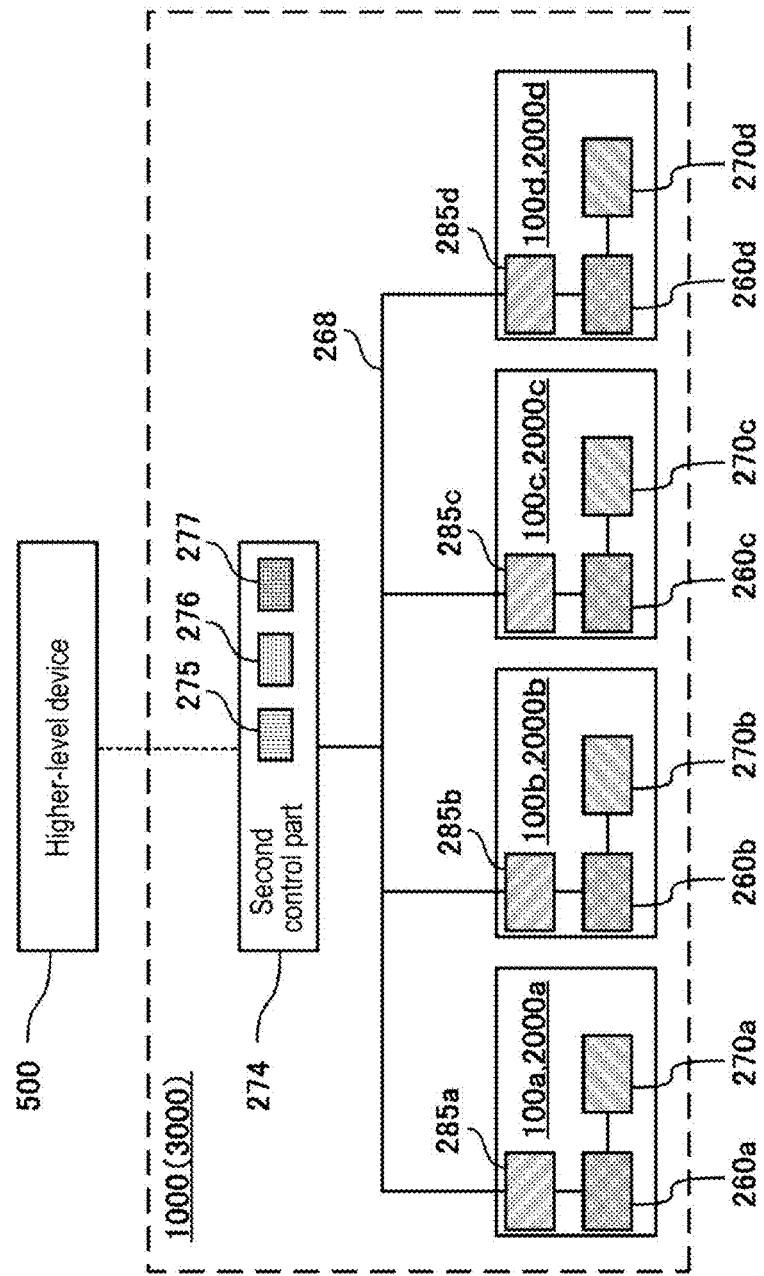
FIG. 1 is a schematic configuration diagram of a substrate processing system according to one embodiment of the present disclosure.
Figure 2:
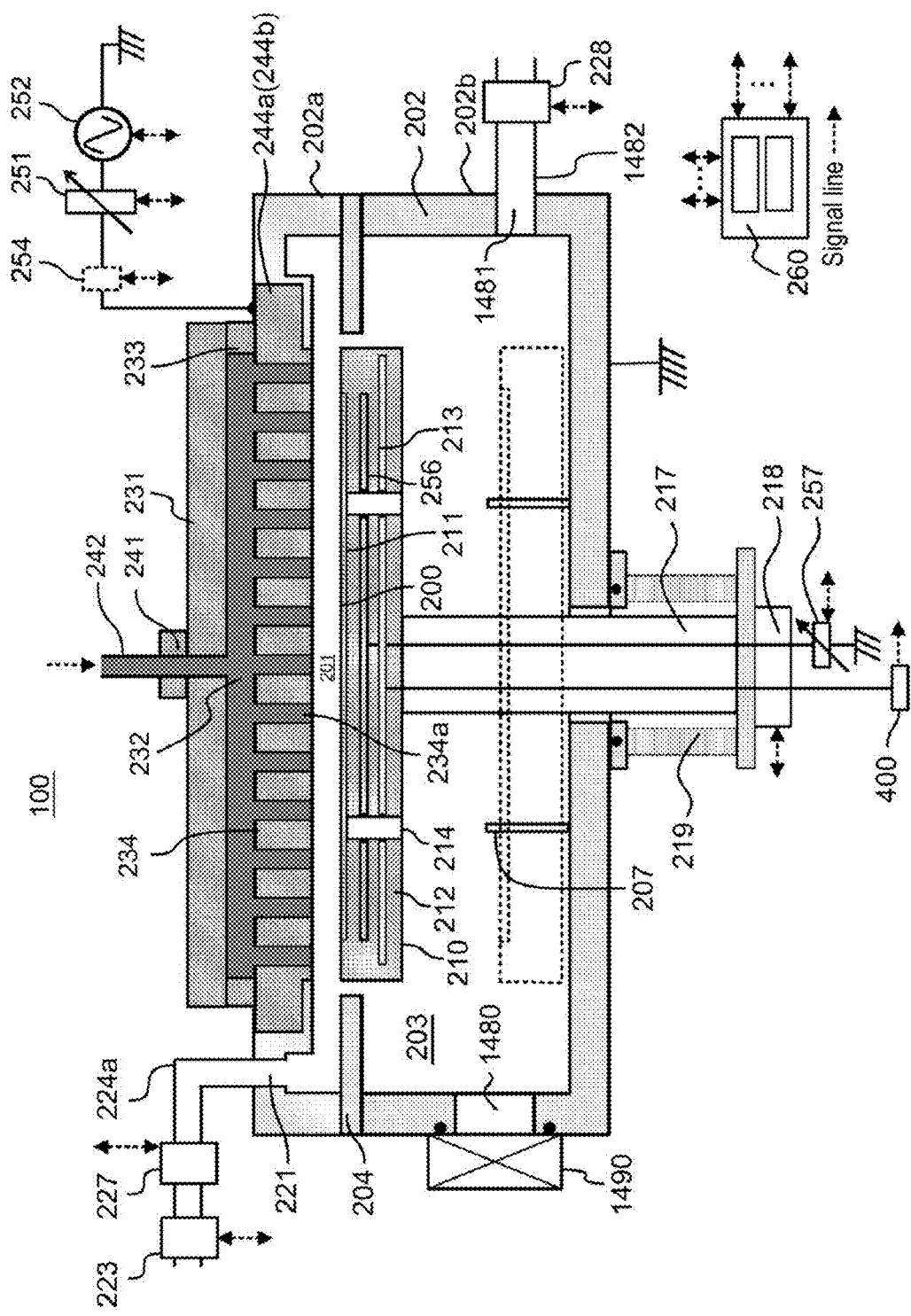
FIG. 2 is a schematic configuration diagram of a substrate processing apparatus according to one embodiment of the present disclosure.
Figure 3:
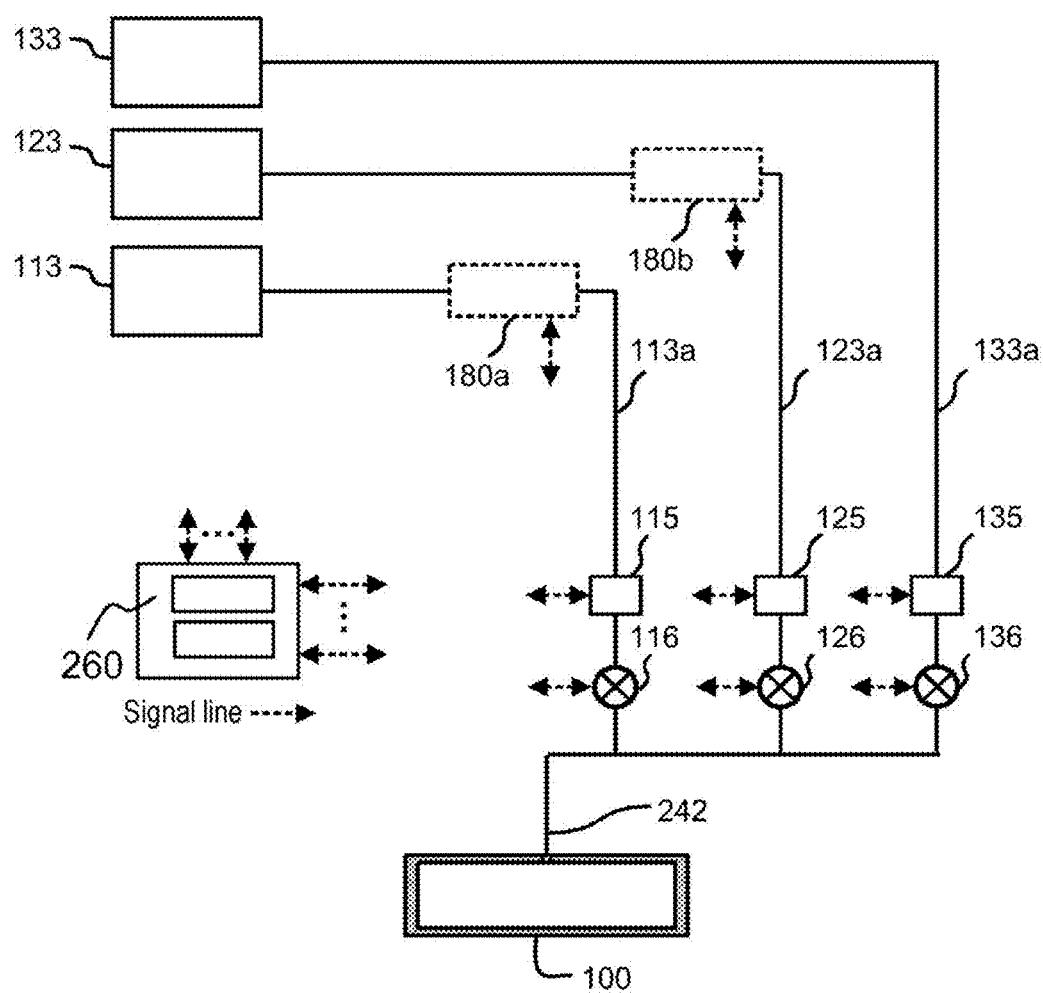
FIG. 3 is a diagram illustrating a gas supply part according to one embodiment of the present disclosure.
Figure 4:
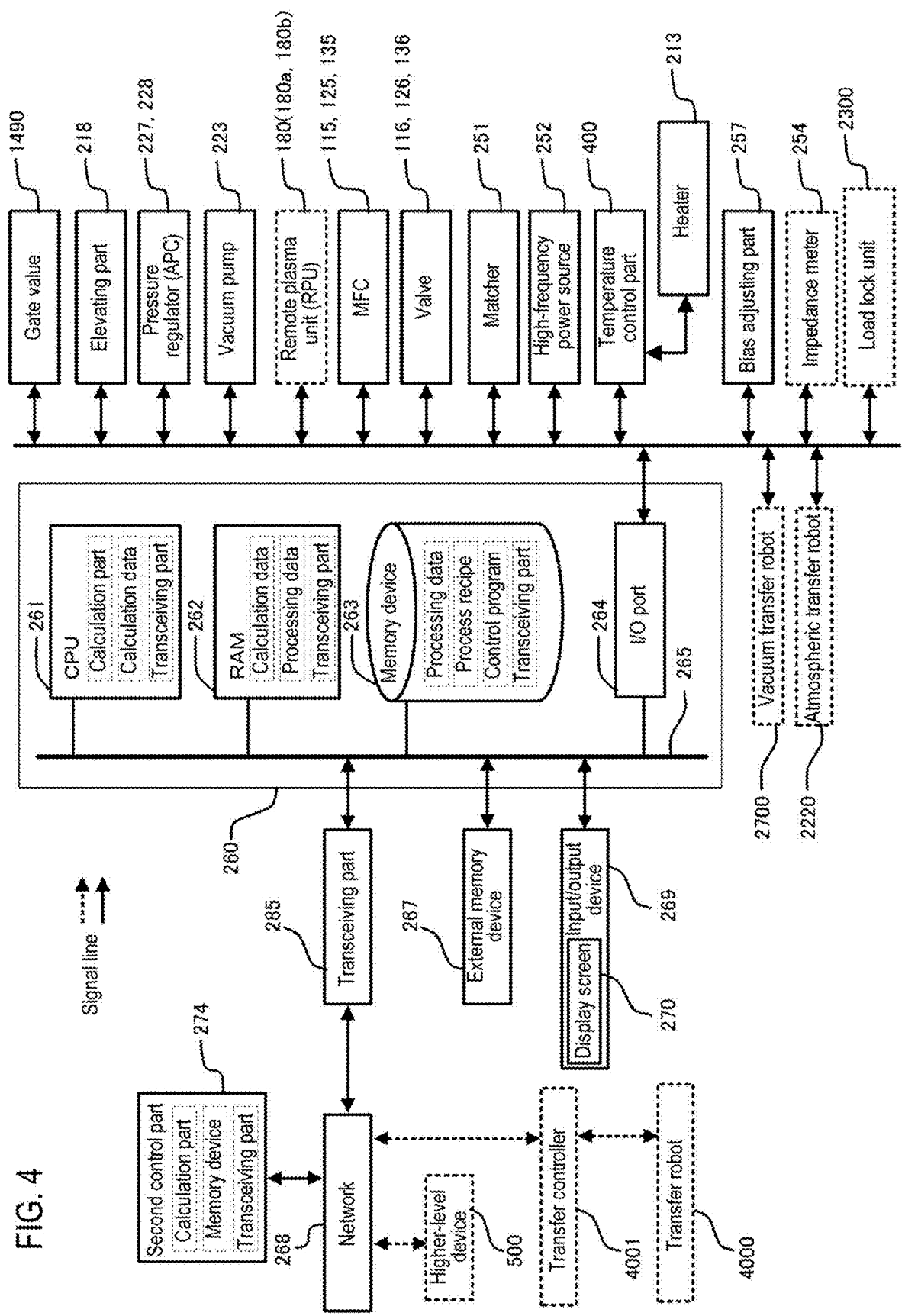
FIG. 4 is a schematic configuration diagram of a controller according to one embodiment of the present disclosure.

A schematic configuration of a substrate processing system according to one embodiment of the present disclosure will be described with reference to FIGS. 1 to 4. FIG. 1 is a diagram illustrating a configuration example of the substrate processing system according to the present embodiment. FIG. 2 is a transversal cross sectional view illustrating a schematic configuration of a substrate processing apparatus according to the present embodiment. FIG. 3 is a schematic configuration diagram of a gas supply system of the substrate processing apparatus according to the present embodiment. FIG. 4 is a schematic configuration diagram illustrating a connection relationship between a controller 260 installed in the substrate process apparatus and the substrate processing system.

In FIG. 1, a substrate processing system 1000 includes a plurality of substrate processing apparatuses 100 (100a, 100b, 100c, and 100d), a second control part 274, and a network 268 that connects them. A higher-level device 500 may be configured as being included in the substrate processing system 1000. The substrate processing apparatus 100 is an apparatus that processes a substrate 200 as one of various processes for manufacturing a semiconductor device. Here, the second control part 274 is, for example, a group management controller. Furthermore, the higher-level device 500 is, for example, a host computer.

When a plurality of substrates 200 are processed using the plurality of substrate processing apparatuses 100 configured as above, the following problems may occur.

(a) The process quality of each substrate may be varied due to a difference in performance (an individual variation) of each substrate processing apparatus.

(b) Since there is no index for correcting such an individual variation, it may take a certain amount of time to adjust the substrate processing apparatus, decreasing the throughput.

(c) A substrate processing apparatus with poor performance may be generated, thus causing a decrease in yield.

(d) In a factory for manufacturing a vast semiconductor device, it may take some time to identify a substrate processing apparatus with poor performance, thus causing a decrease in manufacturing throughput of a semiconductor device.

In order to address these problems, the substrate processing apparatuses 100 of the present disclosure includes a controller 260 (260a, 260b, 260c, and 260d) that acquires various data, display parts 270 (270a, 270b, 270c, and 270d) that display various data, and data transceiving parts 285 (285a, 285b, 285c, and 285d) that transmit and receive various data to and from the second control part 274. The second control part 274 has a first calculation part 275, a first memory part 276, and a first transceiving part 277. The first transceiving part 277 transmits and receives data between the substrate processing apparatuses 100 and the second control part 274. The first memory part 276 records data, data calculated by the first calculation part 275, data transmitted from the higher-level device 500, an arbitrary data inputted by the user, a database of these data, and the like. The first calculation part 275 is configured to perform a calculation process based on at least one of the aforementioned data. The substrate processing system may also be configured as a system 3000 including a plurality of substrate processing systems 2000 (2000a, 2000b, 2000c, and 2000d), which will be described later.

Next, a schematic configuration of the substrate processing apparatus 100 will be described with reference to FIG. 2.

(2) Configuration of Substrate Processing Apparatus

The substrate processing apparatus 100 is, for example, a unit for forming an insulating film on the substrate 200, and is configured as a single-wafer-type substrate processing apparatus as illustrated in FIG. 2. Here, the substrate processing apparatus 100a (100) will be described. The other substrate processing apparatuses 100b, 100c, and 100d have the same configuration, and therefore, descriptions thereof will be omitted.

As illustrated in FIG. 2, the substrate processing apparatus 100 includes a process vessel 202. The process vessel 202 is configured as, for example, a flat airtight vessel having a circular cross section. The process vessel 202 is made of, e.g., a metal material such as aluminum (Al) or stainless steel (SUS), or quartz. A process chamber 201 in which the substrate 200 such as a silicon wafer as a substrate is processed, and a transfer chamber 203 are formed inside the process vessel 202. The process vessel 202 includes an upper vessel 202a and a lower vessel 202b. A partition part 204 is installed between the upper vessel 202a and the lower vessel 202b. A space which is surrounded by the upper vessel 202a and is defined above the partition part 204 will be referred to as the process chamber 201. Furthermore, a space which is surrounded by the lower vessel 202b and is defined near a gate valve 1490 will be referred to as the transfer chamber 203.

A substrate loading/unloading port 1480 adjacent to the gate valve 1490 is formed in a side surface of the lower vessel 202b. The substrate 200 moves between a transfer chamber (not shown) and the transfer chamber 203 via the substrate loading/unloading port 1480. A plurality of lift pins 207 are installed in a lower portion of the lower vessel 202b. The lower vessel 202b is also grounded.

A substrate supporting part 210 that supports the substrate 200 is installed inside the process chamber 201. The substrate supporting part 210 mainly includes a substrate mounting table 212 having a mounting surface 211 on which the substrate 200 is mounted, and a heater 213 as a heating part. Through holes 214 through which the lift pins 207 penetrate are formed in the substrate mounting table 212 at positions corresponding to the lift pins 207, respectively. In addition, a bias electrode 256 for applying a bias to the substrate 200 or the process chamber 201 may be installed in the substrate mounting table 212. Here, a temperature control part 400 is connected to the heater 213. A temperature of the heater 213 is controlled by the temperature control part 400. The temperature information of the heater 213 can be transmitted from the temperature control part 400 to the controller 260. The bias electrode 256 is connected to a bias adjusting part 257 such that the bias can be controlled by the bias adjusting part 257. The bias adjusting part 257 is also configured to transmit and receive the bias data to and from the controller 260.

The substrate mounting table 212 is supported by a shaft 217. The shaft 217 penetrates a lower portion of the process vessel 202, and is connected to an elevating part 218 installed outside the process vessel 202. The substrate 200 mounted on the substrate mounting surface 211 can be elevated and lowered by elevating and lowering the shaft 217 and a substrate mounting table 212 with the operation of the elevating part 218. In addition, the periphery of a lower end portion of the shaft 217 is covered with a bellows 219, so that the interior of the process chamber 201 is hermetically kept. Furthermore, the elevating part 218 may be configured to transmit and receive a height data (position data) of the substrate mounting table 212 to and from the controller 260. At least two positions of the substrate mounting table 212 may be set. For example, the positions include a first process position and a second process position. The first process position and the second process position may be adjusted, respectively.

The substrate mounting table 212 is moved to a wafer transfer position during the transfer of the substrate 200 and is moved to the first process position (a wafer process position) indicated by the solid line in FIG. 2 during a first process of the substrate 200. During a second process, the substrate mounting table 212 is moved to the second process position indicated by the broken line in FIG. 2. The wafer transfer position is a position at which the tips of the lift pins 207 protrude from the upper surface of the substrate mounting surface 211.

Specifically, when the substrate mounting table 212 is lowered to the wafer transfer position, the tips of the lift pins 207 protrude from the upper surface of the substrate mounting surface 211, so that the lift pins 207 support the substrate 200 from below. Furthermore, when the substrate mounting table 212 is elevated up to the wafer process position, the lift pins 207 are moved downward from the upper surface of the substrate mounting surface 211, so that the substrate mounting surface 211 supports the substrate 200 from below. In addition, since the lift pins 207 are in direct contact with the substrate 200, it is desirable to form the lift pins 207 with, for example, a material such as quartz or alumina.

(Exhaust System)

A first exhaust port 221 as a first exhaust part configured to exhaust an internal atmosphere of the process chamber 201 therethrough is formed in a side surface of the process chamber 201 (the upper vessel 202a). An exhaust pipe 224a is connected to the first exhaust port 221. A pressure regulator 227 such as an auto pressure controller (APC) that controls the interior of the process chamber 201 to reach a predetermined pressure, and a vacuum pump 223 are sequentially installed in series in the exhaust pipe 224a. A first exhaust system (exhaust line) is mainly configured by the first exhaust port 221, the exhaust pipe 224a, and the pressure regulator 227. The vacuum pump 223 may also be included in the first exhaust system. In addition, a second exhaust port 1481 through which an internal atmosphere of the transfer chamber 203 is exhausted is formed in the side surface of the transfer chamber 203. An exhaust pipe 1482 is also installed in the second exhaust port 1481. A pressure regulator 228 is installed in the exhaust pipe 1482 so that the interior of the transfer chamber 203 can be adjusted to have a predetermined pressure. Furthermore, the internal atmosphere of the process chamber 201 may be exhausted through the transfer chamber 203. The pressure regulator 227 is also configured to transmit and receive a pressure data and a valve opening degree data to and from the controller 260. In addition, the vacuum pump 223 is configured to transmit an ON/OFF data of the pump, a load data or the like to the controller 260.

(Gas Introduction Hole)

A lid 231 is installed in an upper surface (ceiling wall) of a shower head 234 installed at the upper portion of the process chamber 201. A gas introduction hole 241 through which various kinds of gases are supplied into the process chamber 201 is formed in the lid 231. The configuration of each gas supply unit connected to the gas introduction hole 241 as a gas supply part will be described hereinbelow.

(Gas Dispersion Unit)

The shower head 234 as a gas dispersion unit includes a buffer chamber 232 and a dispersion plate 244a. In addition, the dispersion plate 244a may be configured as a first electrode 244b serving as a first activation part. A plurality of holes 234a for dispersing and supplying a gas to the substrate 200 therethrough is formed in the dispersion plate 244a. The shower head 234 is installed between the gas introduction hole 241 and the process chamber 201. The gas introduced from the gas introduction hole 241 is supplied to the buffer chamber 232 (also referred to as a dispersion part) of the shower head 234, and subsequently, is supplied to the process chamber 201 through the holes 234a.

Furthermore, in the case where the dispersion plate 244a is configured as the first electrode 244b, the first electrode 244b is made of a conductive metal, and is configured as a portion of the activation part (excitation part) for exciting the gas within the process chamber 201. An electromagnetic wave (high-frequency power or microwave) may be supplied to the first electrode 244b. In the case where the lid 231 is formed of a conductive member, an insulating block 233 is installed between the lid 231 and the first electrode 244b, thereby insulating the lid 231 from the first electrode 244b.

(Activation Part (Plasma Generation Part))

A configuration in which the first electrode 244b as the activation part is installed will be described. A matcher 251 and a high-frequency power source 252 are connected to the first electrode 244b as the activation part so that an electromagnetic wave (a high-frequency power or microwaves) is supplied to the first electrode 244b. Therefore, the gas supplied into the process chamber 201 can be activated. In addition, the first electrode 244b is configured to generate a capacitively-coupled plasma. Specifically, the first electrode 244b is formed in a conductive plate shape and is supported by the upper vessel 202a. The activation part is configured by at least the first electrode 244b, the matcher 251, and the high-frequency power source 252. In addition, an impedance meter 254 may be installed between the first electrode 244b and the high-frequency power source 252. By installing the impedance meter 254, the matcher 251 and the high-frequency power source 252 can be feedback-controlled based on the measured impedance. Furthermore, the high-frequency power source 252 is configured to transmit and receive a power data to and from the controller 260. The matcher 251 is configured to transmit and receive a matching data (traveling wave data or reflective wave data) to and from the controller 260. The impedance meter 254 is configured to transmit and receive an impedance data to and from the controller 260.

(Supply System)

A common gas supply pipe 242 is connected to the gas introduction hole 241. The interior of the common gas supply pipe 242 has a communication structure. The gas supplied from the common gas supply pipe 242 is supplied into the shower head 234 through the gas introduction hole 241.

A gas supply part illustrated in FIG. 3 is connected to the common gas supply pipe 242. A first gas supply pipe 113a, a second gas supply pipe 123a, and a third gas supply pipe 133a are connected to the gas supply part.

A first element-containing gas (first process gas) is mainly supplied from a first gas supply part including the first gas supply pipe 113a. A second element-containing gas (second process gas) is mainly supplied from a second gas supply part including the second gas supply pipe 123a. A third element-containing gas is mainly supplied from a third gas supply part including the third gas supply pipe 133a.

(First Gas Supply Part)

A first gas supply source 113, a mass flow controller (MFC) 115 as a flow rate controller (flow rate control part), and a valve 116 as an opening/closing valve are installed in the first gas supply pipe 113a sequentially from the corresponding upstream side.

The first element-containing gas is supplied from the first gas supply pipe 113a to the shower head 234 via the MFC 115, the valve 116, and the common gas supply pipe 242.

The first element-containing gas is one of the process gases. The first element-containing gas is a gas containing silicon (Si), for example, a gas such as a hexachlorodisilane ($Si_2Cl_6$, abbreviation: HCDS) gas or the like.

The first gas supply part is mainly configured by the first gas supply pipe 113a, the MFC 115, and the valve 116.

In addition, one or both of the first gas supply source 113 and a remote plasma unit (RPU) 180a for activating a first gas may be regarded as being included in the first gas supply part.

(Second Gas Supply Part)

A second gas supply source 123, an MFC 125, and a valve 126 are installed in the second gas supply pipe 123a sequentially from the corresponding upstream side.

The second element-containing gas is supplied from the second gas supply pipe 123a into the shower head 234 via the MFC 125, the valve 126, and the common gas supply pipe 242.

The second element-containing gas is one of the process gases. The second element-containing gas is a gas containing nitrogen (N), for example, a gas such as an ammonia ($NH_3$) gas, a nitrogen ($N_2$) gas or the like.

The second gas supply part is mainly configured by the second gas supply pipe 123a, the MFC 125, and the valve 126.

In addition, one or both of the second gas supply source 123 and a remote plasma unit (RPU) 180b for activating the first gas may be regarded as being included in the second gas supply part.

(Third Gas Supply Part)

A third gas supply source 133, an MFC 135, and a valve 136 are installed in the third gas supply pipe 133a sequentially from the corresponding upstream side.

An inert gas is supplied from the third gas supply pipe 133a to the shower head 234 via the MFC 135, the valve 136, and the common gas supply pipe 242.

The inert gas is a gas that has difficulty reacting with the first gas. The inert gas is, for example, a gas such as a nitrogen ($N_2$) gas, an argon (Ar) gas, or a helium (He) gas.

The third gas supply part is mainly configured by the third gas supply pipe 133a, the MFC 135, and the valve 136.

Here, the MFC, the valve, (a vaporizer), and (the RPU) constituting each of the first gas supply part, the second gas supply part, and the third gas supply part are configured to transmit and receive, to and from the controller 260, the following data: the flow rate data for the MFC, the opening degree data for the valve, (the vaporization amount data for the vaporizer), and (the power data for the RPU).

(Control Part)

As illustrated in FIGS. 1 to 3, the substrate processing apparatus 100 includes the controller 260 that controls the operations of the respective parts of the substrate processing apparatus 100.

A schematic configuration diagram of the controller 260, and a connection configuration diagram of the second control part 274, the network 268, the higher-level device 500, and the like are illustrated in FIG. 4. The controller 260, which is a control part, may be configured as a computer including a central processing unit (CPU) 261, a random access memory (RAM) 262, a memory device 263, and an I/O port 264. The RAM 262, the memory device 263, and the I/O port 264 are configured to exchange data with the CPU 261 via an internal bus 265. An input/output device 269 configured as, for example, a touch panel or the like, an external memory device 267, a transceiving part 285, and the like are connected to the controller 260. The input/output device 269 may also be configured to include a display screen 270 as a notification part (display part) that notifies the state of the substrate processing apparatus 100 and data received from the second control part 274.

The memory device 263 is configured by, for example, a flash memory, a hard disk drive (HDD), or the like. A control program for controlling operations of the substrate processing apparatus, a process recipe for specifying sequences and conditions of a substrate process (to be described later), a calculation data or process data generated in the course of setting the process recipe used to process the substrate 200, or the like is readably stored in the memory device 263. The process recipe functions as a program for causing the controller 260 to execute each sequence in the substrate processing step (to be described later) to obtain a predetermined result. Hereinafter, the process recipe and the control program will be generally and simply referred to as a "program". When the term "program" is used herein, it may indicate a case of including only the process recipe, a case of including only the control program, or a case of including both the process recipe and the control program. The RAM 262 is configured as a memory area (work area) in which a program read by the CPU 261 or data such as the calculation data or the process data is temporarily stored.

The I/O port 264 is connected to the respective components of the substrate processing apparatus 100 such as the gate valve 1490, the elevating part 218, the temperature control part 400, the pressure regulators 227 and 228, the vacuum pump 223, the matcher 251, the high-frequency power source 252, the MFCs 115, 125, and 135, the valves 116, 126, and 136, the bias adjusting part 257, and the like. The I/O port 264 may also be connected to the impedance meter 254, the RPU 180, a vacuum transfer robot 2700, an atmospheric transfer robot 2220, and the like. Furthermore, the expression "connection" used in the present disclosure may mean that the respective parts are connected to each other by a physical cable, and also mean that signals (electronic data) of the respective parts can be transmitted and received directly or indirectly.

The CPU 261 as a calculation part is configured to read the control program from the memory device 263 and execute the same. The CPU 261 also reads the process recipe from the memory device 263 according to an operation command inputted from the input/output device 269. Furthermore, the CPU 261 is configured to calculate a calculation data by comparing and calculating the set value inputted from the transceiving part 285 and the process recipe or the control data stored in the memory device 263. Further, the CPU 261 is configured to execute the process of determining a corresponding process data (process recipe) from the calculation data. In addition, the CPU 261 is configured to control, according to the contents of the process recipe thus read, the opening/closing operation of the gate valve 1490, the elevating and lowering operation by the elevating part 218, the operation of supplying electric power to the temperature control part 400, the temperature adjusting operation of the substrate mounting table 212 by the temperature control part 400, the pressure adjusting operation by the pressure regulators 227 and 228, the ON/OFF control operation of the vacuum pump 223, the gas flow rate control operation by the MFCs 115, 125 and 135, the gas activating operation of the RPUs 180a and 180b, the ON/OFF control operation of gas by the valves 116, 126, 136, the power matching operation by the matcher 251, the power control operation of the high-frequency power source 252, the adjustment operation of the bias adjusting part 257, the matching operation of the matcher 251 based on the measurement data measured by the impedance meter 254, the power control operation of the high-frequency power source 252, and the like. The control of the respective parts is performed by transmitting and receiving control information according to the contents of the process recipe through the use of the transceiving part of the CPU 261.

The controller 260 is not limited to a case where it is configured as a dedicated computer, but may be configured as a general purpose computer. For example, the controller 260 according to the present embodiment may be configured by installing, on the general purpose computer, the aforementioned program (data) stored in the external memory device 267 (for example, a magnetic tape, a magnetic disk such as a flexible disk or a hard disk, an optical disc such as a CD or a DVD, a magneto-optical disc such as an MO, or a semiconductor memory such as a USB memory or a memory card). Furthermore, means for supplying the program to the computer is not limited to a case of supplying the program via the external memory device 267. For example, the program (data) may be supplied to the computer using a communication means such as the transceiving part 285 or the network 268 (Internet or a dedicated line), instead of using the external memory device 267. In addition, the memory device 263 or the external memory device 267 is configured as a non-transitory computer-readable recording medium. Hereinafter, the memory device 263 and the external memory device 267 will be generally and simply referred to as a "recording medium." When the term "recording medium" is used herein, it may indicate a case of including only the memory device 263, a case of including only the external memory device 267, or a case of including both the memory device 263 and the external memory device 267.

(2) Substrate Processing Step

A process example of forming an insulating film on a substrate and updating the setting of each substrate processing apparatus using the result of film formation, which is one of various processes for manufacturing a semiconductor device, and an example of the process flow of the aforementioned substrate processing system 1000 and a table of each data will be described below with reference to FIGS. 5 to 8. For example, a silicon nitride (SiN) film as a nitride film is formed as the insulating film. The manufacturing process is performed by the substrate processing system 1000 and the substrate processing apparatus 100 described above. In the following descriptions, the operations of the respective parts are controlled by the controller 260.

Hereinafter, a substrate processing step will be described.

(Apparatus Setting Step S300)

When a substrate is processed, first, a process recipe to be performed in each substrate processing apparatus 100 is set in the controller 260. For example, the data recorded in the memory device 263 is read in the RAM 262 and a set value is set in each part via the I/O port 264. Furthermore, the setting of the process recipe may be performed by transmitting the process recipe from the second control part 274 or the higher-level device 500 connected via the network 268. After the operation of each part is set, a manufacturing step S301 is performed.

(Manufacturing Step S301)

At the manufacturing step S301, a first gas is supplied to the process chamber 201 by controlling the first gas supply part and the process chamber 201 is exhausted by controlling the exhaust system to process the substrate 200, according to the process recipe. In some embodiments, the second gas supply part may be controlled to supply a second gas into the process space so that the second gas exists in the process space together with the first gas and a CVD process is performed. Alternatively, a cyclic process may be performed by alternately supplying the first gas and the second gas. In addition, in the case of processing the second gas under a plasma state, plasma may be generated inside the process chamber 201 by supplying a high-frequency power to the first electrode 244b. A method of activating the second gas using the RPU 180b may also be used.

As the cyclic process, which is a specific example of a film processing method, the following method may be considered. For example, a dichlorosilane ($SiH_2Cl_2$: DCS) gas may be used as the first gas and an ammonia ($NH_3$) gas may be used as the second gas. At a first step, the DCS gas is supplied to the substrate 200, and at a second step, the $NH_3$ gas is supplied to the substrate 200. At a purge step between the first step and the second step, an $N_2$ gas is supplied and the internal atmosphere of the process chamber 201 is exhausted. By performing the cyclic process of performing the first step, the purge step, and the second step a plurality of times, a silicon nitride (SiN) film is formed on the substrate 200. In the case of performing the process using plasma, the second gas is plasmarized by supplying a high-frequency power to one or both of the first electrode 244b and the RPU 180b at least in the course of supplying the second gas.

The manufacturing step S301 is performed in this manner. After the manufacturing step S301, an apparatus data acquiring step S302 of acquiring data of each part constituting the apparatus is performed.

(Apparatus Data Acquiring Step S302)

Data (apparatus data) of each part is transmitted to the controller 260 via a signal line. The controller 260 receives the data of each part by the I/O port 264 as a data receiving part and records the received data in either or both of the RAM 262 and the memory device 263. In this case, the received data is converted into a first apparatus data and calculated in the CPU 261. The first apparatus data generated by the CPU 261 is recorded in either or both of the RAM 262 and the memory device 263. Specifically, the first apparatus data is, for example, data indicated in a table of FIG. 6. The data (measurement value) of each part is stored in measurement value tables X1 to X6 of each part. Score data is generated according to a degree of gap between the stored measurement values and a reference value B. The score data is stored in tables a1 to a6 of the first apparatus data A1. The sum of each score data is also stored in a comprehensive evaluation table αa. In this example, although a temperature, a gas flow rate, a process chamber pressure, a high-frequency power, a traveling wave power, and a reflective wave power are indicated as data of a1 to a6, the present disclosure is not limited thereto. In some embodiments, any other measurement value may be added or only a necessary measurement value may be selected to generate the first apparatus data. For example, the opening degree data of the pressure regulator 227, the vaporization amount data of the vaporizer 180, the position data of the substrate mounting table 212, and the load data of the pump may be used as a measurement value 4, a measurement value 5, and a measurement value 6. Furthermore, in the case of the plasma-less process, among the data configuration indicated in FIG. 6, only the data of the measurement value 1, the measurement value 2, and the measurement value 3 may be used, or as described above, the measurement value 4, the measurement 5, and the measurement value 6 may be replaced. The scoring in this case is evaluated in a certain unit according to whether the measurement value is away in a positive direction or in a negative direction from the reference value B. For example, the first apparatus data A1 is outputted based on an arithmetic expression used in the course of checking the integrity of the apparatus by FDC.

(Data Transmitting/Receiving Step S303)

The first apparatus data generated in this manner is transmitted from the transceiving part 285 to the second control part 274 via the network 268. In some embodiments, the first apparatus data may be transmitted to the higher-level device 500 via the network 268. The second control part 274 stores a plurality of first apparatus data transmitted from the controller 260 of each of the substrate processing apparatuses 100 in the first memory part 276 installed in the second control part 274. Specifically, the first memory part 276 has a data table illustrated in FIG. 7 and records a first apparatus data A1, a first apparatus data B1, a first apparatus data C1, . . . , and a first apparatus data N1. In this embodiment, an example in which the first apparatus data A1, B1, and C1 respectively corresponding to the substrate processing apparatuses 100a, 100b, and 100c, and the first apparatus data N1 corresponding to an Nth substrate processing apparatus 100n (not shown) are inputted is illustrated. In this manner, the first apparatus data A1, B1, C1, . . . , N1 are inputted to the data storages a1 to a6, b1 to b6, c1 to c6, . . . , n1 to n6) corresponding to alphabets a, b, c, ..., n of the substrate processing apparatuses, respectively. Data of the comprehensive evaluation is inputted to each of aa, ab, ac, ..., an.

The number of the first apparatus data corresponds to the number N of substrate processing apparatuses 100 in operation, among the substrate processing apparatuses 100 installed in the substrate processing system 1000. The first apparatus data of a certain substrate processing apparatus 100, among the plurality of substrate processing apparatuses 100 installed in the substrate processing system 1000, may be acquired and recorded. Further, a second apparatus data M1 as a sample may have been inputted to the second control part 274. The second apparatus data M1 may be, for example, a higher-level apparatus data, data stored in a control part (not shown) equivalent to a first control part present in another network, a certain apparatus data arbitrarily set by the user, or the like. The higher-level apparatus data is stored from the higher-level device 500 via the network 268. Data of a substrate processing apparatus present in a substrate processing system present in another network is also inputted via the network 268. The certain apparatus data is directly inputted to the second control part 274 by the user. In FIG. 7, data y1 to y6 corresponding to the measurement values 1 to 6 have been inputted as the second apparatus data M1. The comprehensive evaluation data αy and a yield ranking data βy have also been inputted.

In some embodiments, the yield ranking data of the process in each substrate processing apparatus 100 may be stored in yield ranking tables βa to βn from the higher-level device 500 via the network 268, in parallel to storing the plurality of first apparatus data.

(Data Calculation Step S304)

After each data is stored in the first memory part 276 of the second control part 274, the data is calculated in the first calculation part 275. In the case where the data has been inputted to the yield ranking table, priority data corresponding to yield ranking is stored in priority data tables γa to γn. Furthermore, in the case where the data has not been stored in the yield ranking table, the data stored in the comprehensive evaluation data αa to αn of each first apparatus data are compared and the priority data is stored in the priority data tables γa to γn according to a certain rule. In this embodiment, an example in which the priority data is stored in order, starting from that having a largest value of data of the comprehensive evaluation is illustrated. In addition, in the case where the data has been stored in the higher-level apparatus data table, each of the first apparatus data and the higher-level apparatus data may be compared, and the priority data may be stored in order, starting from the first apparatus data having a smallest difference.

Furthermore, based on a first apparatus data corresponding to a lower-level data belonging to a lower-level group, and one or both of a first apparatus data and a second apparatus data corresponding to a higher-level data belonging to a higher-level group, among the priority data, a parameter change data of a substrate processing apparatus corresponding to the lower-level data may be generated. For example, as illustrated in FIG. 8, it is determined whether the change of parameters of the substrate processing apparatus 100c is necessary from a degree of gap between the measurement values based on the first apparatus data C1 as the lower-level data and one or both of the first apparatus data A1 and the higher-level apparatus data as the higher-level data. Determination data of whether the change of parameters is necessary is inputted to the data tables of c1p to c6p. The number of data cells of the data tables is equal to the number of data cells of the data tables of the first apparatus data. It is determined that the change of parameters is necessary when data corresponding to each measurement value is different by a certain numerical value or greater, and the change of parameters is not necessary when the data falls within a certain numerical value range. Further, in some embodiments, the parameter change data may be generated by determining whether the parameter change of the apparatus is necessary from a difference between the first apparatus data whose priority data is minimum (uppermost) and the first apparatus data whose priority data is maximum (lowermost). With this configuration, parameters that need to be changed in the substrate processing apparatuses having a process result with bad characteristics, among the plurality of substrate processing apparatuses, can be discovered at an initial stage. Furthermore, it is possible to suppress the manufacturing throughput of a semiconductor device from being degraded due to the stop of the process caused by maintenance.

(Data Transmitting/Receiving Step S305)

The priority data generated by the second control part 274 is transmitted to one or more components of the controller 260, the higher-level device 500, a transfer robot 4000 (to be described later) and the like of each substrate processing apparatus 100. In the controller 260, the transmitted priority data is recorded in either or both of the RAM 262 and the memory device 263.

(Data Notifying Step S306)

The controller 260 installed in each substrate processing apparatus 100 displays the received priority data on the display screen 270.

(Setting Check Step S307)

The controller 260 checks whether the parameter change data is received and determines whether the check result is Yes or No. If it is determined that the parameter change data is received, the controller 260 decides the check result as Yes. If the determination result is Yes, a parameter change step S308 is performed. On the other hand, if it is determined that the parameter change data is not received, the controller 260 decides the check result as No and executes a transfer setting change step S309.

(Parameter Change Step S308)

Figure 9:
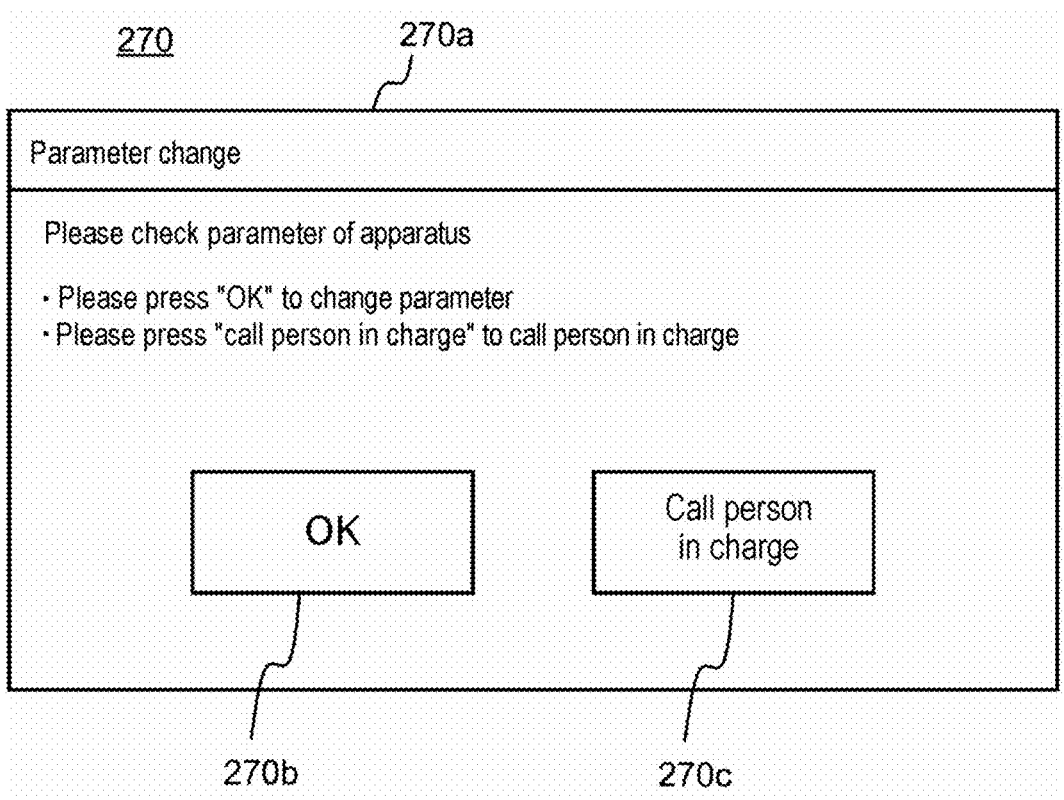
FIG. 9 is an example of a parameter change message according to one embodiment of the present disclosure.

At the parameter change step S308, why the change of parameters is necessary is displayed on the display screen 270. For example, a parameter change message 270a as illustrated in FIG. 9 is displayed on the display screen 270. The parameter change message 270a has at least an OK button 270b. When the OK button 270b is pressed, a parameter change screen 270d is displayed as illustrated in FIG. 10. On the parameter change screen 270d, parameters which are determined that the change of parameters is necessary in FIG. 8 are displayed in such a manner that data can be entered, and parameters which are determined that the change of parameters is not necessary are displayed in such a manner that data cannot be entered. By displaying the parameters that need to be changed in this manner, it is possible to shorten the maintenance time to make the performance for each substrate processing apparatus 100 uniform. That is to say, it is possible to improve the manufacturing throughput of a semiconductor device by the maintenance time.

Figure 11:
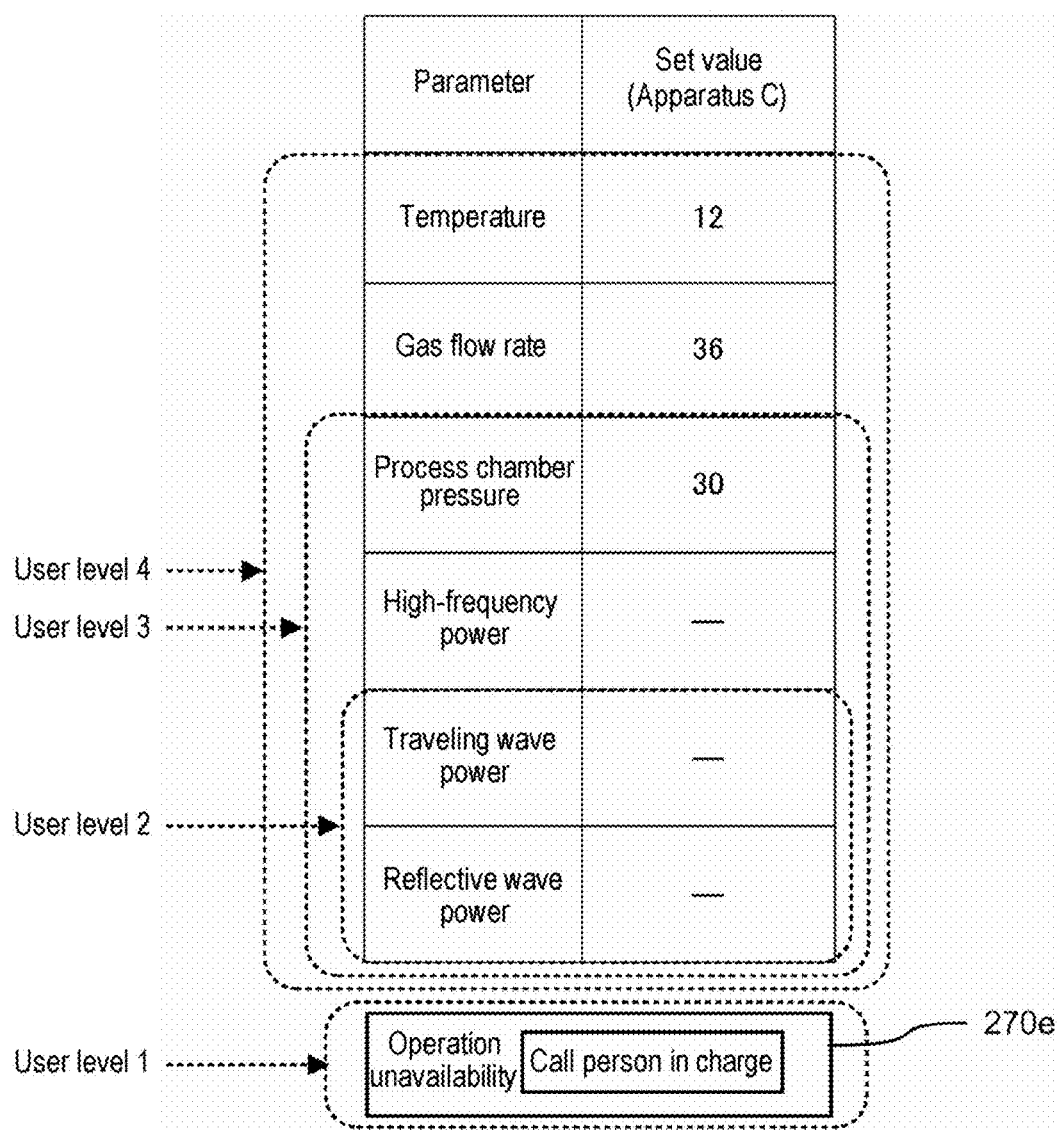
FIG. 11 is an example of a parameter changeable range according to an account level according to one embodiment of the present disclosure.

The parameters for which data can be entered at that time may also be changed according to an account level (user level) of a user (operator) who operates the substrate processing apparatus 100 (the input/output device 269). FIG. 11 illustrates an example of an operation range of parameters according to an account level of a user. In FIG. 11, an example of an operation range of each of user levels 1 to 4 is illustrated. In the user level 1, the operation of all the parameters is unavailable and a message 270e indicating that the operation is unavailable is displayed on the display screen 270. In the case of displaying the operation unavailability, a notification data requesting an operable user level staff may also be transmitted to the second control part 274 or the higher-level device 500. As illustrated in FIG. 11, a button for calling a person in charge may also be displayed. When the button for calling a person in charge is pressed, the controller 260 may transmit data calling the person in charge to one or both of the second control part 274 and the higher-level device 500. Subsequently, the user level 2 is set to adjust a traveling wave power and a reflective wave power. The user level 3 is set to regulate a process chamber pressure and a high-frequency power, in addition to the parameters operable by the user level 2. The user level 4 is set to adjust a temperature and a gas flow rate, in addition to the parameters operable by the user level 3. In this manner, the parameters can be changed according to the account level of the user. With this configuration, it is possible to avoid making an erroneous change when changing the parameters.

(Transfer Setting Change Step S309)

Figure 12:
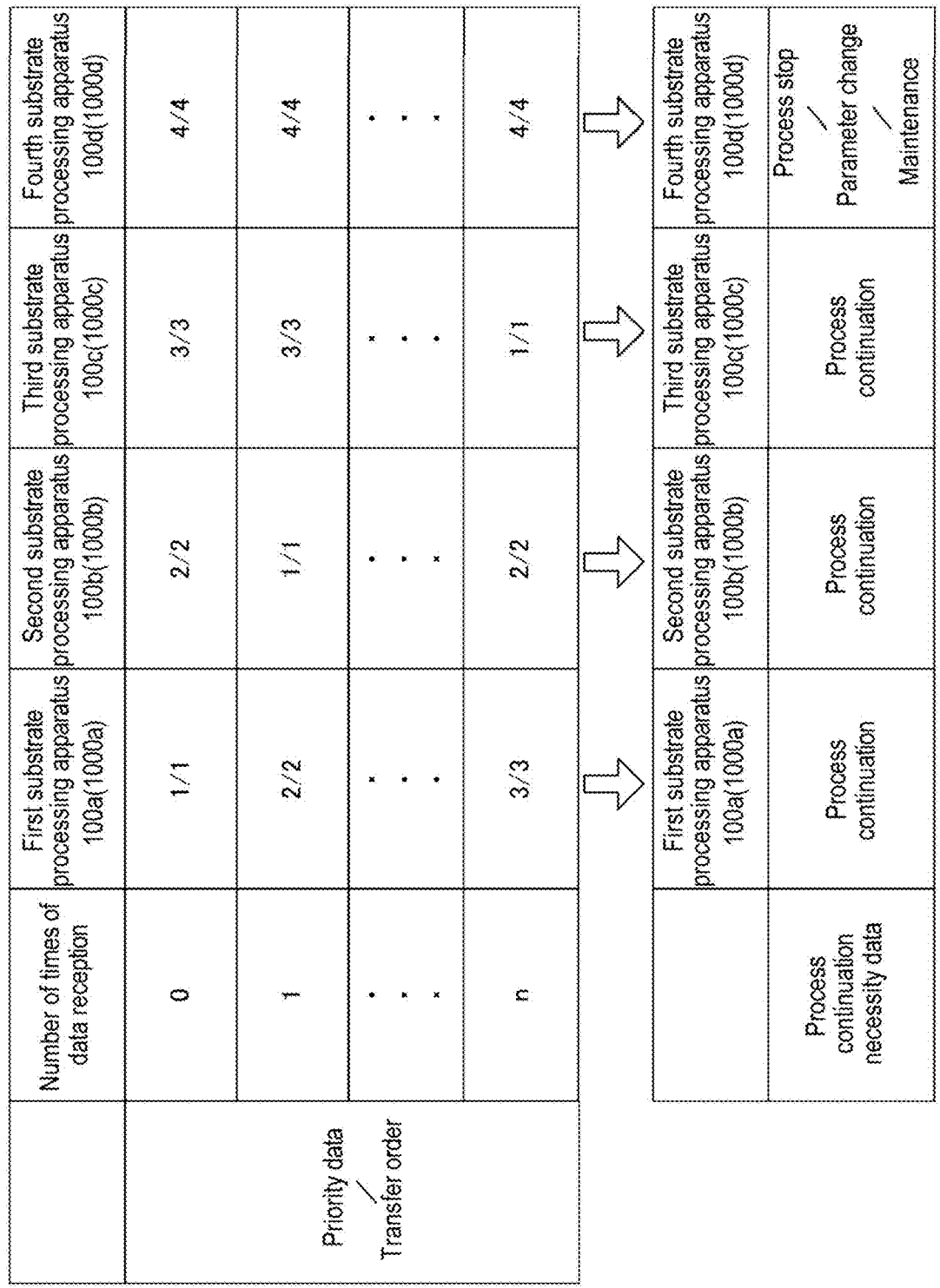
FIG. 12 is an example of setting a transfer order based on a priority data according to one embodiment of the present disclosure.

At the transfer setting change step S309, the second control part 274 generates a transfer data for setting usage priority (transfer order) of each substrate processing apparatus 100 based on the priority data. The transfer data is transmitted to at least one of the higher-level device 500, and a transfer controller 4001 which controls the transfer robot 4000 for transferring the substrate 200 or pods 2001 (to be described later). For example, as illustrated in FIG. 12, before the priority data is received (when the number of times of data reception is 0), the substrate is transferred in the order of the first substrate processing apparatus 100a, the second substrate processing apparatus 100b, the third substrate processing apparatus 100c, and the fourth substrate processing apparatus 100d, and after the priority data is received, the transfer order of the substrate is changed to the order of the second substrate processing apparatus 100b, the first substrate processing apparatus 100a, the third substrate processing apparatus 100c, and the fourth substrate processing apparatus 100d. In this manner, whenever the priority data is received, the transfer order is changed. With this configuration, it is possible to continuously perform the substrate process of desired characteristics. Furthermore, the example in which the transfer setting change step S309 is performed after the setting check step S307 is illustrated, but the present disclosure is not limited thereto. For example, the transfer setting change step S309 may be performed after the priority data is generated.

In addition, when a state in which the transfer order belongs to the lower-level group is continued for a predetermined number of times or when the number that the transfer order belongs to the lower-level group for a predetermined period of time is counted for a predetermined number of times, a process continuation necessity data indicating that the change of parameters is necessary or that the maintenance is necessary may be displayed on the display screen 270. An example thereof is illustrated in FIG. 12. In FIG. 12, regarding the fourth substrate processing apparatus 100d, when a state in which the transfer order is $4^{th}$ is continued n times, data notifying one or more process stop/parameter change/maintenance is generated as the process continuation necessity data. One or both of the second control part 274 and the higher-level device 500 may be notified of the process continuation necessity data. With this configuration, it is possible to avoid the process in the substrate processing apparatus 100 having low priority, and to suppress deterioration in process uniformity (yield) for each substrate. In some embodiments, when the lowermost state is continued for a predetermined number of times among the transfer orders, the process continuation necessity data may be transmitted.

Furthermore, when the state of the lower-level group in the transfer order is continued for a predetermined number of times or when the transfer order is counted a predetermined number of times for a predetermined period of time, a degeneracy operation may be performed such that the transfer to the substrate processing apparatus 100 whose transfer order belongs to the lower-level group is stopped and only another substrate processing apparatus 100 is used. In some embodiments, a degeneracy operation may be performed such that the transfer to the substrate processing apparatus 100 having a lowest transfer order is stopped and only another substrate processing apparatus 100 is used.

While one embodiment of the present disclosure has been specifically described above, the present disclosure is not limited to the aforementioned embodiment but may be differently modified without departing from the spirit of the present disclosure.

Figure 13:
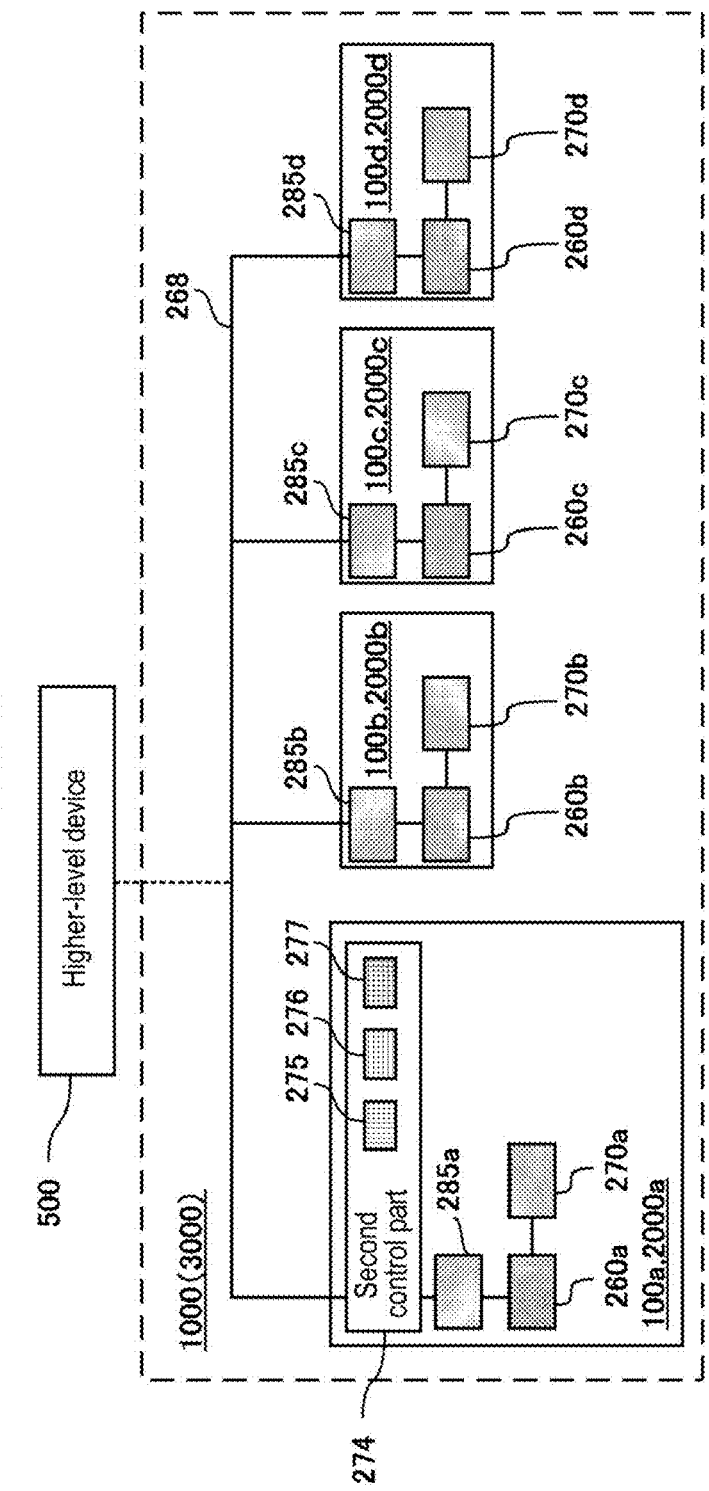
FIG. 13 is a schematic configuration diagram of a substrate processing system according to another embodiment of the present disclosure.

In the above description, the second control part 274 is configured not to be included in each substrate processing apparatus 100, but it may be installed in one of the substrate processing apparatuses 100 as illustrated in FIG. 13. FIG. 13 illustrates an example in which the second control part is installed inside the first substrate processing apparatus 100a.

In addition, although there has been described an example in which the display screen 270 is incorporated in the input/output device 269, the present disclosure is not limited thereto. In some embodiments, the display screen 270 and the input/output device 269 may be installed independently of one another. For example, a display may be installed independently from the input/output device.

Furthermore, in the substrate processing system 1000 described above, the configuration in which the substrate processing apparatus 100 that processes one sheet of substrate is controlled by the second control part 274 has been described, but the present disclosure is not limited thereto. In a substrate processing system 3000 illustrated in FIG. 14, a plurality of cluster type substrate processing apparatuses 2000 each including a plurality of substrate processing apparatuses 100 may be prepared. The plurality of cluster type substrate processing apparatuses 2000 may be controlled by the second control section 274.

The cluster type substrate processing apparatus 2000 processes the substrates 200, and mainly includes an IO stage 2100, an atmospheric transfer chamber 2200, a load lock (L/L) 2300, a vacuum transfer chamber 2400, and substrate processing apparatuses 100 (100a, 100b, 100c, and 100d). Next, each component will be described in detail. In the description of FIG. 14, it is assumed that the X1 direction is right, the X2 direction is left, the Y1 direction is front, and the Y2 direction is rear.

(Atmospheric Transfer Chamber and IO Stage)

The IO stage (load port) 2100 is installed in the front of the cluster type substrate processing apparatus 2000. A plurality of pods 2001 are mounted on the IO stage 2100. The pods 2001 are used as carriers for transferring the substrate 200. A plurality of unprocessed substrates 200 and a plurality of processed substrates 200 are stored in the pods 2001 in a horizontal posture, respectively.

The pod 2001 is transferred to the IO stage 2100 by the transfer robot 4000 that transfers the pod 2001. The transfer robot 4000 is controlled by the transfer controller 4001. A transfer data for setting the transfer order in the transfer controller 4001 may be controlled by the second control part 274 or may be controlled by the higher-level device 500. The respective components are connected to each other via the network 268. The higher-level device 500 or the second control part 274 controls the transfer robot 4000 to transfer the pods 2001 onto the IO stage 2100 of each cluster type substrate processing apparatus 2000 in a predetermined transfer order based on the priority data mentioned above.

The IO stage 2100 is disposed adjacent to the atmospheric transfer chamber 2200. The load lock chamber 2300 (to be described later) is connected to a surface of the atmospheric transfer chamber 2200, which is different from that of the IO stage 2100.

The atmospheric transfer robot 2220 as a first transfer robot for transferring the substrate 200 is installed inside the atmospheric transfer chamber 2200.

(Load Lock (L/L) Chamber)

The load lock chamber 2300 is disposed adjacent to the atmospheric transfer chamber 2200. The internal pressure of the L/L chamber 2300 varies depending on the internal pressure of the atmospheric transfer chamber 2200 and the internal pressure of the vacuum transfer chamber 2400. Thus, the L/L chamber 2300 is structured to withstand a negative pressure.

(Vacuum Transfer Chamber)

The cluster type substrate processing apparatus 2000 includes the vacuum transfer chamber (transfer module: TM) 2400 as a transfer chamber serving as a transfer space where the substrate 200 is transferred under a negative pressure. A housing 2410 constituting the TM 2400 is formed in a pentagon in a plan view. The L/L chamber 2300 and the substrate processing apparatus 100 that processes the substrate 200 are connected to each side of the pentagon. The vacuum transfer robot 2700 as a second transfer robot that transfers the substrate 200 under a negative pressure is installed substantially at the center of the TM 2400. In addition, although an example in which the vacuum transfer chamber 2400 is formed in a pentagon has been described above, the vacuum transfer chamber 2400 may be formed in a polygon such as a quadrangle or a hexagon.

The vacuum transfer robot 2700 installed in the TM 2400 includes two arms 2800 and 2900 that can operate independently of one another. The vacuum transfer robot 2700 is controlled by the controller 260 described above. In the case where the priority (transfer order) data using the plurality of substrate processing apparatuses 100 installed in the cluster type substrate processing apparatus 2000 is set, the controller 260 may be configured to set the vacuum transfer robot 2700 based on the priority data. That is to say, in this embodiment, the controller 260 is configured to perform the same data process as that of the second control part. With this configuration, it is possible to further improve the yield of substrate process.

The gate valve (GV) 1490 is installed in each substrate processing apparatus, as illustrated in FIG. 14. Specifically, a gate valve 1490*a* is installed between the substrate processing apparatus 100*a* and the TM 2400, and a GV 1490*b* is installed between the substrate processing apparatus 100*b* and the TM 2400. A GV 1490*c* is installed between the substrate processing apparatus 100*c* and the TM 2400, and a GV 1490*d* is installed between the substrate processing apparatus 100*d* and the TM 2400.

By performing the opening/closing operation by each GV 1490, the substrate 200 can be loaded and unloaded through the substrate loading/unloading port 1480 installed in each substrate processing apparatus 100.

In the above description, there has been described a method in which a film is formed by alternately supplying the first gas and the second gas, but the present disclosure is applicable to other methods. For example, the present disclosure is applicable to a method in which the supply timing of the first gas and the supply timing of the second gas overlap.

Furthermore, while in the above embodiment, there has been described a method in which a process is performed by supplying two kinds of gases, a process using one kind of gas may be used.

Moreover, in the above description, the film forming process has been described, but the present disclosure is applicable to other processes. Examples thereof include a diffusion process using plasma, an oxidizing process, a nitriding process, an oxynitriding process, a reduction process, an oxidation reduction process, an etching process, a heating process, and the like. For example, the present disclosure may also be applied to a plasma oxidation process or plasma nitridation process of a film formed on a substrate surface or a substrate using only a reaction gas. Further, the present disclosure may also be applied to a plasma annealing process using only a reaction gas. These processes may be performed as the first process and thereafter the second process described above may be performed.

In addition, in the above embodiment, there has been described the process of manufacturing a semiconductor device, but the present disclosure according to the embodiment may be applied to processes other than the process of manufacturing a semiconductor device. For example, the present disclosure may be applied to a substrate process such as a process of manufacturing a liquid crystal device, a process of manufacturing a solar cell, a process of manufacturing a light emitting device, a process of processing a glass substrate, a process of processing a ceramic substrate, a process of processing a conductive substrate, and the like.

Furthermore, in the above embodiment, there has been described an example in which a silicon nitride film is formed using a silicon-containing gas as a precursor gas and a nitrogen-containing gas as a reactive gas, but the present disclosure is applicable to the formation of a film using other gases. For example, the present disclosure is applicable to the formation of an oxygen-containing film, a nitrogen-containing film, a carbon-containing film, a boron-containing film, a metal-containing film, a film containing a plurality of se elements, or the like. These films include, for example, an AlO film, a ZrO film, an HfO film, an HfAlO film, a ZrAlO film, an SiC film, an SiCN film, an SiBN film, a TiN film, a TiC film, a TiAlC film, and the like.

Moreover, in the above embodiment, an apparatus configuration in which one sheet of substrate is processed in a single process chamber has been illustrated. However, the present disclosure is not limited thereto and it may be an apparatus in which a plurality of substrates is arranged in a horizontal direction or in a vertical direction.

According to the present disclosure in some embodiments, it is possible to improve a process uniformity for each substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system, comprising:
a plurality of substrate processing apparatuses;
a plurality of first control parts installed in the plurality of substrate processing apparatuses, respectively, each of the plurality of first control parts being configured to:
generate first apparatus data for a corresponding substrate processing apparatus among the plurality of substrate processing apparatuses, based on one or more measurement values for measurable parameters associated with one or more states of at least one part constituting the corresponding substrate processing apparatus, wherein the first apparatus data corresponds to score data associated with a degree and a direction of a gap between a reference value and a measurement value for each of the parameters, and the parameters include at least one selected from the group consisting of temperature, process chamber pressure, high-frequency power, reflective wave power, and traveling wave power; and
transmit the first apparatus data from the corresponding substrate processing apparatus;
a second control part configured to:
receive the first apparatus data from each of the plurality of substrate processing apparatuses;
generate priority data indicating any one of a plurality of usage priority levels for each of the plurality of substrate processing apparatuses according to a predetermined rule by comparing the first apparatus data from each of the plurality of substrate processing apparatuses with one another, the plurality of usage priority levels including a first level and a second level that is higher than the first level;
transmit the priority data to each of the plurality of first control parts;
generate, based on the first apparatus data corresponding to the first level and one or both of the first apparatus data corresponding to the second level and second apparatus data recorded in the second control part, parameter change data that is indicative of a change in a value for at least one parameter for at least one of the plurality of substrate processing apparatuses corresponding to the first level; and
transmit the parameter change data to at least one of the plurality of first control parts; and
a display part configured to display the priority data.

2. The system of claim 1, wherein the at least one of the plurality of first control parts is configured to control the display part to display changeable parameters among a plurality of parameters of the plurality of substrate processing apparatuses, based on the parameter change data and a user level of each of the plurality of substrate processing apparatuses.

3. The system of claim 2, wherein the second control part is configured to generate the priority data a plurality of times and subsequently transmit a signal to one or more first control parts among the plurality of first control parts of the plurality of substrate processing apparatuses in which the number of processes is equal to or greater than a predetermined number of times, the signal indicating that process continuation necessity data includes a change of at least one of the parameters or includes one or both of a process stop and a maintenance parameter change.

4. The system of claim 1, wherein the second control part is configured to set a usage priority of each of the plurality of substrate processing apparatuses based on the priority data, and transmit transfer data so that a substrate is transferred to each of the plurality of substrate processing apparatuses based on the usage priority.

5. The system of claim 1, wherein the second control part is configured to generate the priority data a plurality of times and subsequently transmit a signal to one or more first control parts among the plurality of first control parts of the plurality of substrate processing apparatuses in which the number of processes is equal to or greater than a predetermined number of times, the signal indicating that process continuation necessity data includes a change of at least one of the parameters or includes one or both of a process stop and a maintenance parameter change.

6. The system of claim 1, wherein the one or more parameters are associated with one or more states of a process chamber of each of the plurality of substrate processing apparatuses, and
wherein the parameters include at least one selected from the group consisting of temperature, gas flow rate, and pressure.

7. The system of claim 1, wherein the one or more parameters are associated with one or more states of a process chamber of each of the plurality of substrate processing apparatuses, and
wherein the parameters include at least one selected from the group consisting of temperature, gas flow rate, pressure, high-frequency power, and reflective wave power.

8. The system of claim 1, further comprising a plurality of sets of measuring devices, each set of measuring devices of the plurality of sets of measuring devices including one or more measuring devices and being configured to measure the one or more parameters of one of the plurality of substrate processing apparatuses while substrates are processed.

9. The system of claim 1, wherein the second control part is configured to generate the plurality of usage priority levels, each of which is generated for one of the plurality of substrate processing apparatuses based on the first apparatus data.

10. The system of claim 1, wherein the priority data and the parameter change data are generated based on the first apparatus data.

11. A method of manufacturing a semiconductor device, comprising:
processing a substrate in each of a plurality of substrate processing apparatuses;
generating first apparatus data for a corresponding substrate processing apparatus among the plurality of substrate processing apparatuses, based on one or more measurement values for measurable parameters associated with one or more states of at least one part constituting the corresponding substrate processing apparatus, wherein the first apparatus data corresponds to score data associated with a degree and a direction of a gap between a reference value and a measurement value for each of the parameters, and the parameters include at least one selected from the group consisting of temperature, process chamber pressure, high-frequency power, reflective wave power, and traveling wave power;
transmitting the first apparatus data from each of the plurality of substrate processing apparatuses to a second control part by each of a plurality of first control parts installed in the plurality of substrate processing apparatuses, respectively;

generating priority data indicating any one of a plurality of usage priority levels for each of the plurality of substrate processing apparatuses according to a predetermined rule by comparing the first apparatus data from each of the plurality of substrate processing apparatuses with one another, and transmitting the priority data to each of the plurality of first control parts by the second control part, the plurality of usage priority levels including a first level and a second level that is higher than the first level;

displaying the priority data on a display part installed in each of the plurality of substrate processing apparatuses by each of the plurality of first control parts;

generating, based on the first apparatus data corresponding to the first level and one or both of the first apparatus data corresponding to the second level and second apparatus data recorded in the second control part, parameter change data that is indicative of a change in a value for at least one parameter for at least one of the plurality of substrate processing apparatuses corresponding to the first level, and transmitting the parameter change data to at least one of the plurality of first control parts by the second control part; and displaying a parameter change message on the display part based on the parameter change data by the at least one of the plurality of first control parts.

12. The method of claim 11, further comprising controlling the display part to display changeable parameters among a plurality of parameters of the plurality of substrate processing apparatuses, based on the parameter change data and a user level of each of the plurality of substrate processing apparatuses by the at least one of the plurality of first control parts.

13. The method of claim 11, further comprising setting a usage priority of each of the plurality of substrate processing apparatuses based on the priority data, and transmitting transfer data so that the substrate is transferred to each of the plurality of substrate processing apparatuses based on the usage priority by the second control part.

14. The method of claim 11, further comprising generating the priority data a plurality of times and subsequently transmitting a signal to one or more first control parts among the plurality of first control parts of the plurality of substrate processing apparatuses in which the number of processes is equal to or greater than a predetermined number of times by the second control part, the signal indicating that process continuation necessity data includes a change of at least one of the parameters or includes one or both of a process stop and a maintenance parameter change.

15. A non-transitory computer-readable recording medium storing a program that causes a substrate processing system, by a computer, to perform a process comprising:

processing a substrate in each of a plurality of substrate processing apparatuses;

generating first apparatus data for a corresponding substrate processing apparatus among the plurality of substrate processing apparatuses, based on one or more measurement values for measurable parameters associated with one or more states of at least one part constituting the corresponding substrate processing apparatus, wherein the first apparatus data corresponds to score data associated with a degree and a direction of a gap between a reference value and a measurement value for each of the parameters, and the parameters include at least one selected from the group consisting of temperature, process chamber pressure, high-frequency power, reflective wave power, and traveling wave power;

transmitting the first apparatus data from each of the plurality of substrate processing apparatuses to a second control part by each of a plurality of first control parts installed in the plurality of substrate processing apparatuses, respectively;

generating priority data indicating any one of a plurality of usage priority levels for each of the plurality of substrate processing apparatuses according to a predetermined rule by comparing the first apparatus data from each of the plurality of substrate processing apparatuses with one another, and transmitting the priority data to each of the plurality of first control parts by the second control part, the plurality of usage priority levels including a first level and a second level that is higher than the first level;

displaying the priority data on a display part installed in each of the plurality of substrate processing apparatuses by each of the plurality of first control parts;

generating, based on the first apparatus data corresponding to the first level and one or both of the first apparatus data corresponding to the second level and a second apparatus data recorded in the second control part, parameter change data that is indicative of a change in a value for at least one parameter for at least one of the plurality of substrate processing apparatuses corresponding to the first level, and transmitting the parameter change data to at least one of the plurality of first control parts by the second control part; and displaying a parameter change message on the display part based on the parameter change data by the at least one of the plurality of first control parts.

16. The recording medium of claim 15, wherein the process further comprising controlling the display part to display changeable parameters among a plurality of parameters of the plurality of substrate processing apparatuses, based on the parameter change data and a user level of each of the plurality of substrate processing apparatuses by the at least one of the plurality of first control parts.

17. The recording medium of claim 15, wherein the process further comprising setting a usage priority of each of the plurality of substrate processing apparatuses based on the priority data, and transmitting transfer data so that the substrate is transferred to each of the plurality of substrate processing apparatuses based on the usage priority by the second control part.

* * * * *